United States Patent
Yasui

(10) Patent No.: US 12,108,537 B2
(45) Date of Patent: Oct. 1, 2024

(54) COMPONENT MOUNTING SYSTEM

(71) Applicant: FUJI CORPORATION, Chiryu (JP)

(72) Inventor: Yoshihiro Yasui, Nagoya (JP)

(73) Assignee: FUJI CORPORATION, Chiryu (JP)

(*) Notice: Subject to any disclaimer, the term of this patent is extended or adjusted under 35 U.S.C. 154(b) by 585 days.

(21) Appl. No.: 17/422,928

(22) PCT Filed: Feb. 13, 2019

(86) PCT No.: PCT/JP2019/005040
§ 371 (c)(1),
(2) Date: Jul. 14, 2021

(87) PCT Pub. No.: WO2020/165966
PCT Pub. Date: Aug. 20, 2020

(65) Prior Publication Data
US 2022/0095501 A1    Mar. 24, 2022

(51) Int. Cl.
| | | |
|---|---|---|
| *B23P 19/00* | (2006.01) | |
| *B65G 1/04* | (2006.01) | |
| *G05B 15/02* | (2006.01) | |
| *H05K 13/04* | (2006.01) | |
| *H05K 13/08* | (2006.01) | |

(52) U.S. Cl.
CPC .......... *H05K 13/0882* (2018.08); *B65G 1/04* (2013.01); *G05B 15/02* (2013.01)

(58) Field of Classification Search
CPC ............. H05K 13/021; H05K 13/0417; H05K 13/085; H05K 13/0882; G05B 15/02; B65G 1/04
See application file for complete search history.

(56) References Cited

U.S. PATENT DOCUMENTS

| | | | |
|---|---|---|---|
| 11,350,551 B2 * | 5/2022 | Matsushita | H05K 13/086 |
| 11,470,751 B2 * | 10/2022 | Ao | H05K 13/0417 |
| 2021/0227731 A1 * | 7/2021 | Oyama | H05K 13/02 |

FOREIGN PATENT DOCUMENTS

| | | |
|---|---|---|
| EP | 3 923 691 A1 | 12/2021 |
| WO | WO 2016/013107 A1 | 1/2016 |
| WO | WO 2018/087854 A1 | 5/2018 |

OTHER PUBLICATIONS

International Search Report issued on Apr. 23, 2019 in PCT/JP2019/005040 filed on Feb. 13, 2019, 2 pages.

* cited by examiner

*Primary Examiner* — Paul D Kim
(74) *Attorney, Agent, or Firm* — Oblon, McClelland, Maier & Neustadt, L.L.P.

(57) ABSTRACT

A component mounting system includes a component mounting machine group, a storage container, and a loader. The storage container is provided at an upstream side or a downstream side of the component mounting machine group and has a storage area configured to support detachably multiple component supply devices that are arranged in an aligned fashion. The loader automatically detach and/or attach the component supply devices from and/or to the component mounting machines and the storage container. The storage area is divided by a boundary into a collection area configured to detachably support the component supply device for collection that is not used for production and a supply area configured to detachably support the component supply device for supply that is used for production.

7 Claims, 6 Drawing Sheets

COMPONENT MOUNTING SYSTEM

TECHNICAL FIELD

The present description discloses a component mounting system.

BACKGROUND ART

Conventionally, there has been known a component mounting system in which a storage container is provided at an upstream side of a component mounting machine group, which is made up by aligning multiple component mounting machines along a board conveyance direction, and a loader automatically detaches and/or attaches a feeder from and/or to the component mounting machines and the storage container (refer to Patent Literature 1). There has also been known a component mounting machine fitted with a feeder stocking area in which a used feeder collection area is disposed adjacent to the feeder stock area (refer to Patent Literature 2). In this component mounting machine, a component run-out feeder, from which all the components have been used up, is collected into the used feeder collection area, while a still-usable feeder, which still holds remaining usable components, is collected in the feeder stocking area.

PATENT LITERATURE

Patent Literature 1: Leaflet of International Publication No. 2018/087854
Patent Literature 2: Leaflet of International Publication No. 2016/013107

BRIEF SUMMARY

Technical Problem

However, with Patent Literature 1, since feeders are stored in the storage container without considering their applications, there have been cases in which feeders that are used for production and feeders that are not used for production are stored in a mixed fashion. Due to this, when a feeder detaching or attaching operation is performed by the loader or an operator in which a feeder is detached from or attached to the storage container by the loader or the operator, there have been cases in which the movement distance gets long or the operation time gets long. On the other hand, with Patent Literature 2, feeders from which components are used up and feeders which still hold usable components are stored not in the storage container but in the component mounting machine while being separated from each other. Even in a case that the feeders from which the components are used up and the feeders which still hold the usable components are stored while being separated in a similar fashion to that described above in the storage container, when both the feeders from which the components are used up and the feeders which still hold the usable components are not planned to be used for production, the operator is required to remove both the feeders from the storage container, and hence, there is no point in separating them from each other for storage.

The present disclosure has been made in view of the problems described heretofore, and a main object thereof is to improve convenience in performing detaching and attaching operations of detaching and attaching a component supply device that is not used for production and a component supply device that is used for production from and to a storage container.

Solution to Problem

According to the present disclosure, there is provided a component mounting system including:
a component mounting machine group made up by aligning multiple component mounting machines along a conveyance direction of a mounting target object, the component mounting machines each including multiple component supply devices that are set detachably and configured to mount a component supplied by the component supply devices onto the mounting target object;
a storage container provided at an upstream side or a downstream side of the component mounting machine group and having a storage area configured to support detachably some of the multiple component supply devices that are arranged in an aligned fashion; and
a loader configured to move along the conveyance direction to automatically detach and/or attach the component supply devices from and/or to the component mounting machines and the storage container,
wherein the storage area is divided by a boundary into a collection area configured to detachably support the component supply device for collection that is not used for production and a supply area configured to detachably support the component supply device for supply that is used for production.

With this component mounting system, the storage area is divided by the boundary into the collection area configured to detachably support the component supply device for collection that is not used for production and the supply area configured to detachably support the component supply device for supply that is used for production. As a result, the component supply device that is not used for production and the component supply device that is used for production are never stored in the storage area in a mixed fashion. This improves the convenience when the loader or the operator performs the detaching and attaching operations of detaching and attaching the component supply devices from and to the storage container.

DESCRIPTION OF EMBODIMENTS

Figure 1:
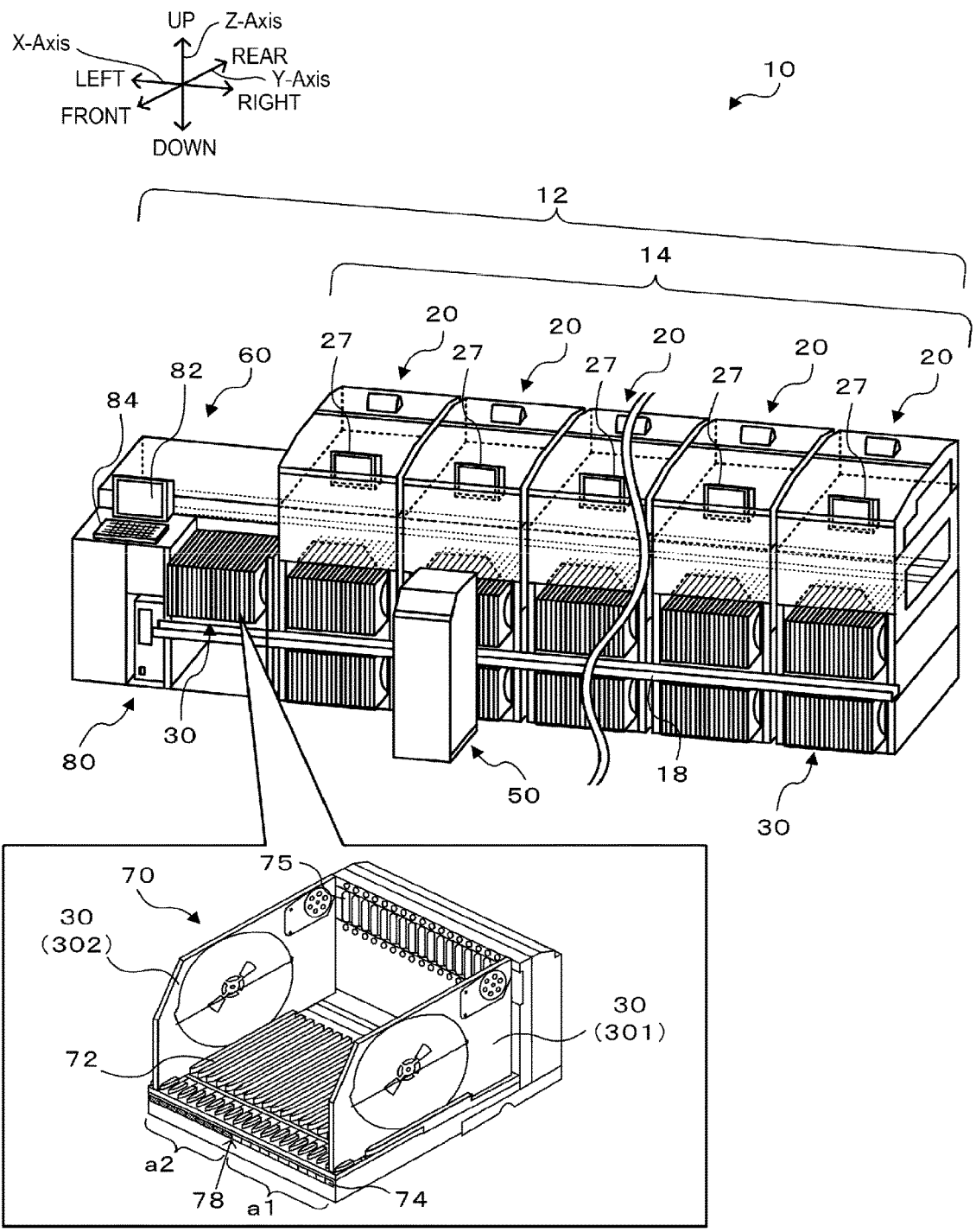
FIG. 1 is a perspective view schematically showing component mounting system 10.
Figure 2:
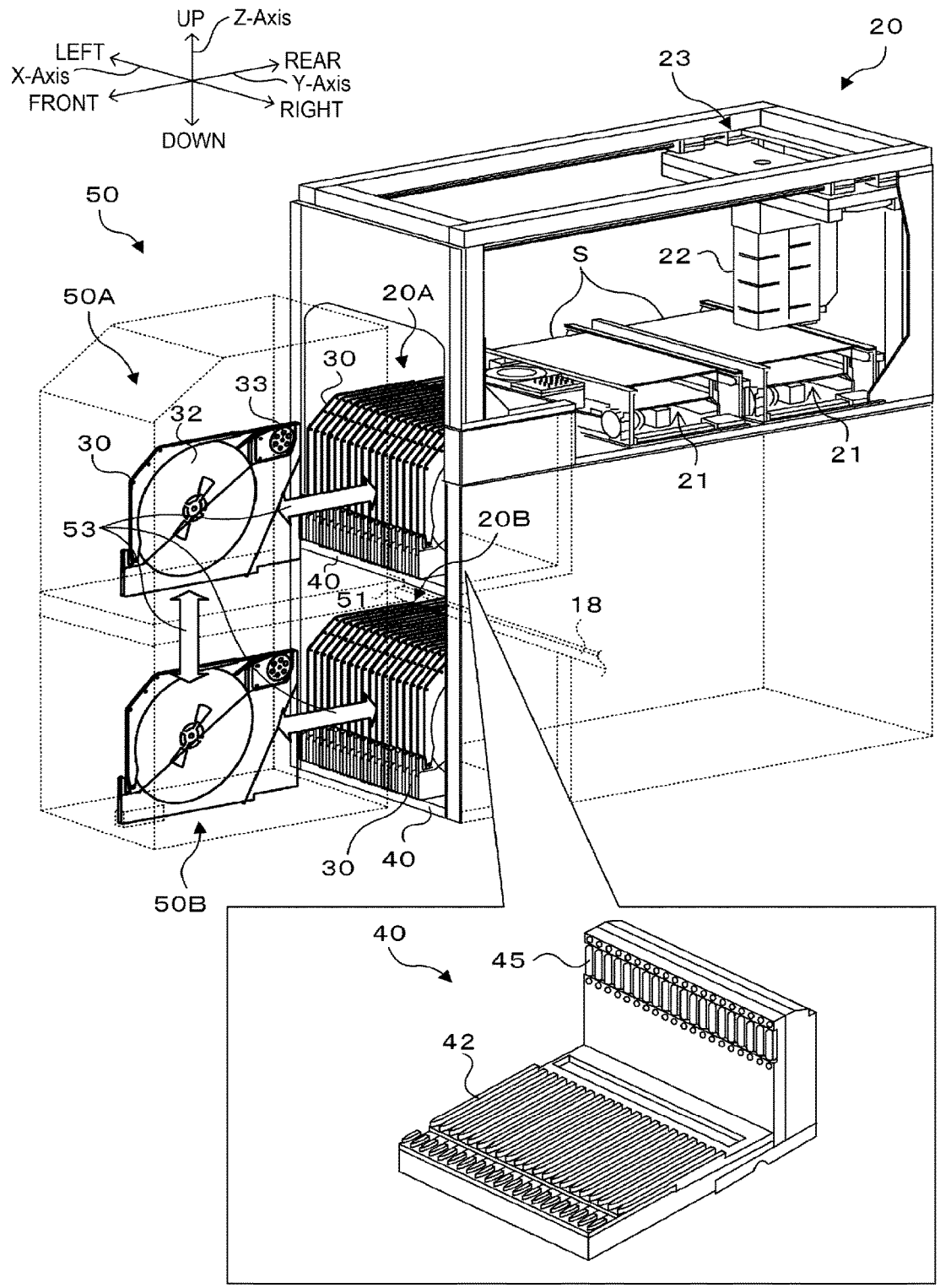
FIG. 2 is a perspective view schematically showing component mounting machine 20.
Figure 3:
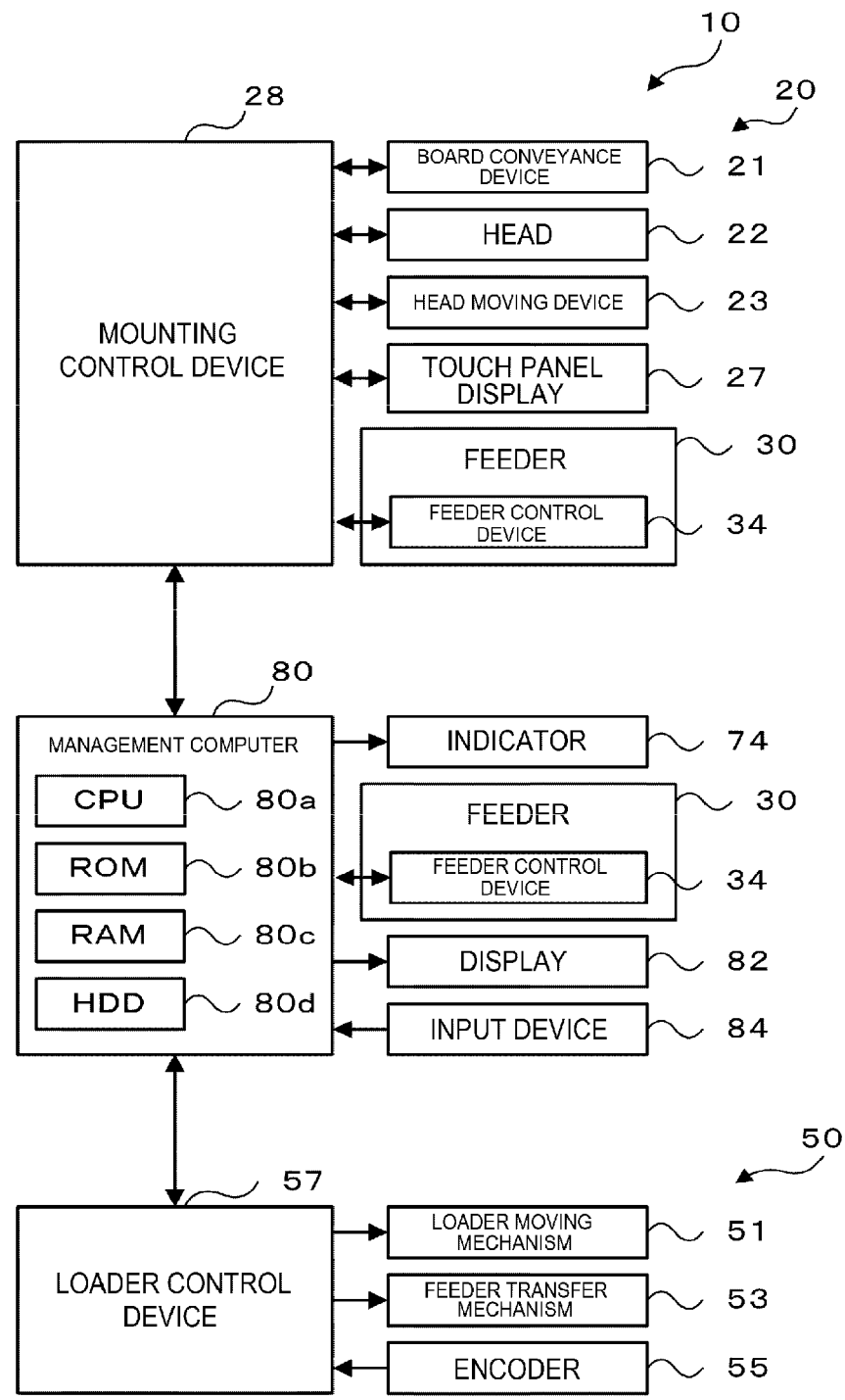
FIG. 3 is a block diagram showing a configuration related to a control of component mounting system 10.

Next, embodiments of the present disclosure will be described by referring to drawings. FIG. 1 is a perspective view schematically showing component mounting system 10 according to an embodiment of the present disclosure, FIG. 2 is a perspective view schematically showing component mounting machine 20, and FIG. 3 is a block diagram showing a configuration related to a control of component mounting system 10. In FIG. 1, a left-right direction constitutes an X-direction, a front-rear direction constitutes a Y-direction, and an up-down direction constitutes a Z-direction.

As shown in FIG. 1, component mounting system 10 includes component mounting line 12, loader 50, and management computer 80. Component mounting machine group 14 and feeder storage 60 are aligned in the X-direction in component mounting line 12. Multiple component mounting machines 20 are aligned in the X-direction in component mounting machine group 14. Component mounting machine 20 mounts a component supplied from feeder 30 onto board S (refer to FIG. 2). Board S is conveyed from a left-hand side (an upstream side) to a right-hand side (a downstream side) of component mounting line 12 along the X-direction. Feeder storage 60 is disposed at an upstream side of component mounting machine group 14 and stores feeder 30 (feeder 301 for collection or collection feeder 31) that is not scheduled to be used for production and feeder 30 (feeder 32 for supply or supply feeder 302) that is scheduled to be used for production. Loader 50 can automatically exchange feeders 30 between component mounting machine 20 or feeder storage 60 and itself. Management computer 80 manages a whole of component mounting system 10.

As shown in FIG. 2, component mounting machine 20 includes board conveyance device 21 for conveying board S in the X-direction, head 22 having a nozzle for picking up a component supplied by feeder 30, head moving mechanism 23 for moving head 22 in XY-directions, and touch panel display 27 (refer to FIG. 1). In addition, component mounting machine 20 includes mounting control device 28 (refer to FIG. 3) made up of known CPU, ROM, RAM, and the like. Mounting control device 28 controls a whole of component mounting machine 20. Mounting control device 28 can receive signals inputted from and output signals to board conveyance device 21, head 22, head moving mechanism 23, touch panel display 27, and the like. In addition, component mounting machine 20 has two upper and lower areas to which feeders 30 can be attached at a front portion thereof. The upper area is supply area 20A where feeder 30 can supply components, while the lower area is stock area 20B where feeder 30 can be stocked. Feeder base 40, having an L-shape in a side view, is provided in supply area 20A and stock area 20B. Multiple feeders 30 are detachably attached to each feeder base 40.

As shown in FIG. 2, feeder 30 is configured as a tape feeder for feeding a tape that accommodates components at predetermined pitches. Feeder 30 includes tape reel 32 around which a tape is wound, tape feeding mechanism 33 for feeding the tape from tape reel 32, and feeder control device 34 (refer to FIG. 3). In addition, as shown in FIG. 2, feeder base 40 includes multiple slots 42 which are arranged at predetermined intervals in the X-direction for feeder 30 to be inserted individually. When feeder 30 is inserted into slot 42 of feeder base 40, a connector, not shown, of feeder 30 is connected to connector 45 of feeder base 40. As a result, feeder control device 34 can communicate with a control section (mounting control device 28, management computer 80, and the like) of a feeder destination part where feeder 30 is attached. Feeder control device 34 causes tape feeding mechanism 33 to feed out a component accommodated in the tape to a predetermined component supply position, and causes again tape feeding mechanism 33 to feed out a component accommodated in the tape to the predetermined component supply position when the component in the component supply position is picked up by the nozzle of head 22.

As shown in FIG. 1, loader 50 can move along X-axis rail 18 provided to run on front surfaces of multiple component mounting machines 20 and a front surface of feeder storage 60 in parallel to the conveyance direction (X-direction) of a board, whereby loader 50 automatically detaches and/or attaches feeder 30 from and/or to component mounting machines 20 and feeder storage 60. As shown in FIGS. 2 and 3, loader 50 includes loader moving mechanism 51 and feeder transfer mechanism 53. Loader moving mechanism 51 moves loader 50 along X-axis rail 18. Feeder transfer mechanism 53 attaches feeder 30 from loader 50 to component mounting machine 20 and feeder storage 60, detaches feeder 30 from component mounting machine 20 and feeder storage 60 to house it in loader 50, and moves feeder 30 between upper transfer area 50A and lower transfer area 50B. As shown in FIG. 3, loader 50 also includes encoder 55 and loader control device 57. Encoder 55 detects a movement position of loader 50 in the X-direction. Loader control device 57 is made up of known CPU, ROM, RAM, and the like. Loader control device 57 receives a detection signal inputted from encoder 55 and outputs a drive signal to loader moving mechanism 51 and feeder transfer mechanism 53.

Feeder storage 60 has feeder base 70 (refer to FIG. 1) having almost the same configuration as that of feeder base 40 provided in component mounting machine 20 for accommodation of multiple feeders 30. Feeder base 70 includes multiple slots 72 which are arranged at predetermined intervals in the X-direction for feeder 30 to be inserted individually. Slots 72 each support corresponding feeder 30 removably. Multiple slots 72 so arranged are divided by boundary 78 in such a way as to constitute collection area a1 and supply area a2. Collection area a1 is an area where to store feeder 301 for collection or collection feeder 301 that is not used for production, and supply area a2 is an area where to store feeder 302 for supply or supply feeder 302 that is used for production. Collection feeder 301 is feeder 30 that is not used for production, for example, feeder 30 whose components have all been used up, feeder 30 that is not scheduled to be used for future production although it still holds components remaining therein, and the like. Supply feeder 302 is feeder 30 that is used for production, for example, new feeder 30 or feeder 30 that still holds components remaining therein that is to be exchanged with feeder 30 whose components have all been used up, feeder 30 that is scheduled to be used for a subsequent production job, and the like. Collection area a1 is provided on a side closer to component mounting machine group 14, while supply area a2 is provided on a side farther from component mounting machine group 14. Indicators 74, each made up of an LED, are provided on a front surface of feeder base 70 in such a manner as to be positioned individually to face corresponding slots 72. When indicator 74 is illuminated in red, it indicates that slot 72 facing that indicator 74 belongs to collection area a1, whereas when indicator 74 is illuminated in green, it indicates that slot 72 facing that indicator 74 belongs to supply area a2. As a result, boundary 78 is formed between that red indicator 74 and that green indicator 74. It should be noted that indicators 74 may be illuminated in other different colors from red and green. In addition, indicators 74 may be so divided based not on colors but on illuminated states (turn-on/turn-off) instead of coloring. The illumination control of indicators 74 is executed by management computer 80. When feeder 30 is inserted into slot 72 of feeder base 70, a connector, not shown, of feeder 30 is connected to connector 75 of feeder base 70. As a result, feeder control device 34 can communicate with a control section (mounting control device 28, management computer 80, and the like) of a feeder destination part where feeder 30 is attached.

As shown in FIG. 3, management computer 80 is made up of known CPU 80a, ROM 80b, RAM 80c, HDD 80d, and the like and is connected to display 82 such as LCD, input device 84 such as a keyboard and a mouse, and the like. HDD 80d of management computer 80 stores a production program (a program related to a plan that specifies types of components to be mounted on board S, the number of boards with such components to be fabricated, and the like), a production job (a job that specifies types and orders of feeders 30 to be set on feeder base 40, types and orders of components to be mounted on board S, and the like for each component mounting machine 20), and the like. The production program is stored in HDD 80d of management computer 80 by an operator operating input device 84. The production job is set based on the production program by CPU 80a of management computer 80 and is stored in HDD 80d. In setting the production job, management computer 80 sets a mounting sequence based on the production program, distributes the mounting sequence to each component mounting machine 20, sets a mounting order of components distributed to each component mounting machine 20, sets how to arrange feeders 30 for each component mounting machine 20, and sets the production jobs for all those component mounting machines 20 so that the production efficiency of component mounting line 12 is increased as high as possible. As a result, when production programs are switched, production jobs for each component mounting machine 20 are also switched. Management computer 80 is connected with mounting control device 28 and loader control device 57 so as to enable a bidirectional communication therebetween. Management computer 80 receives information on a mounting status of component mounting machine 20 from mounting control device 28 and receives information on a driving status of loader 50 from loader control device 57. Management computer 80 is communicably connected to feeder control device 34 of feeder 30 so as to be able to obtain information on stored feeder 30.

Next, an operation (a component mounting action) will be described in which mounting control device 28 of component mounting machine 20 causes component mounting machine 20 to mount a component on board S based on a production job that mounting control device 28 receives from management computer 80. First, mounting control device 28 causes the nozzle of head 22 to pick up a component supplied from feeder 30. Specifically, mounting control device 28 causes head moving mechanism 23 to move the nozzle of head 22 to a position lying directly above a desired component supply position. Next, mounting control device 28 causes the nozzle to be lowered and then causes a negative pressure to be supplied to the nozzle. As a result, the desired component is picked up at a distal end of the nozzle. Thereafter, mounting control device 28 causes the nozzle to be lifted up and then causes head moving mechanism 23 to move the nozzle, which has picked up the desired component, to a position lying above a predetermined position on board S. Then, mounting control device 28 causes the nozzle to be lowered at the predetermined position and then causes the atmospheric pressure to be supplied to the nozzle. As a result, the component picked up and held to the nozzle is allowed to leave from the nozzle to be mounted on board S in the predetermined position. Other components to be mounted on board S are also mounted on board S in a similar manner, and when all the components to be mounted are mounted completely on board S in question, mounting control device 28 causes that board S to be fed to component mounting machine 20 residing on a downstream side.

Next, a processing operation will be described in which management computer 80 sets boundary 78. CPU 80a of management computer 80 predicts the number of collection feeders 301, sets boundary 78 of feeder base 70 of feeder storage 60 based on the predicted number of collection feeders 301, and performs an illumination control of indicators 74 of feeder base 70 in accordance with boundary 78 so set.

Figure 4:
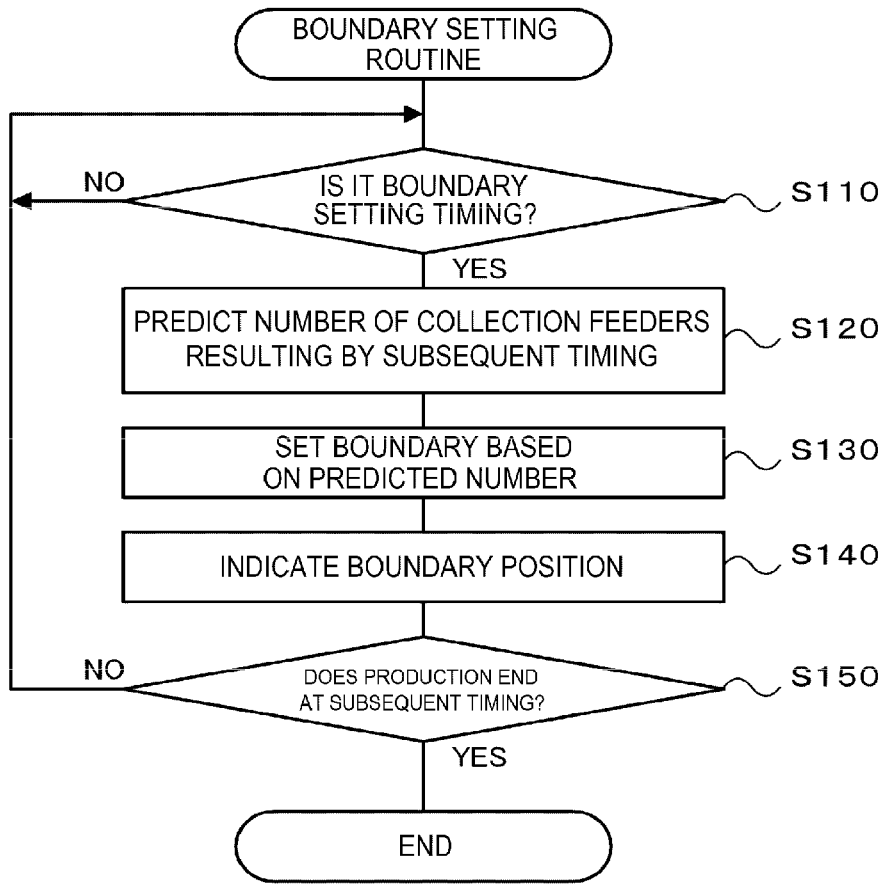
FIG. 4 is a flowchart showing an example of a boundary setting routine.

An example of a boundary setting routine executed by management computer 80 will be described below by use of a flowchart shown in FIG. 4. The boundary setting routine shown in FIG. 4 is a routine that is executed within a time period from a start of processing of a certain production program to an end of the processing in component mounting line 12. In this case, component mounting machines 20 involved in a production in component mounting line 12 repeatedly execute production jobs set individually for those component mounting machines 20 until the production program is completed.

Figure 5:
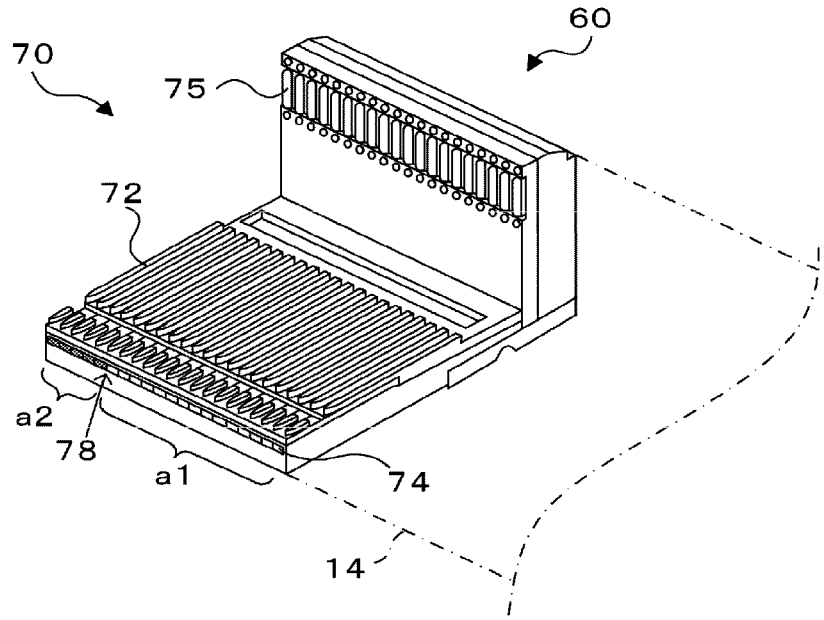
FIG. 5 is a perspective view of feeder base 70 in feeder storage 60.

When starting the boundary setting routine shown in FIG. 4, CPU 80a of management computer 80 first determines whether it is a timing right now at which the boundary is to be set (S110). The boundary setting timing is a timing that occurs at predetermined time intervals (for example, every 10 minutes or every 30 minutes) after the production program is started to be processed. If it is determined in step S110 that it is not the boundary setting timing right now, CPU 80a returns to step S110 again. On the other hand, if it is determined in step S110 that it is the boundary setting timing right now, CPU 80a predicts the number of collection feeders 301 that will be resulting by the occurrence of a subsequent boundary setting timing (S120). This prediction is made based on the operating conditions (the number of remaining components or the like) of feeders 30 that are set in each component mounting machine 20 and the production job of that component mounting machine 20. For example, if in certain component mounting machine 20, the production job can be executed n times by the occurrence of a subsequent boundary setting timing, and the number of remaining components of certain feeder 30 set in that component mounting machine 20 is smaller than a total number of components to be used in the production jobs that are carried out n times, that particular feeder 30 is counted as collection feeder 301. Subsequently, CPU 80a sets boundary 78 based on the predicted number of collection feeders 301 (S130). CPU 80a sets correction area a1 so that the number of free slots 72 in collection area a1 becomes equal to the predicted number of collection feeders 301. In association with this, not only is boundary 78 set, but also supply area a2 is set. Subsequently, CPU 80a causes the position of boundary 78 so set to be indicated by controlling illumination of indicators 74 based on that boundary 78 (S140). Subsequently, CPU 80a determines whether the processing of the production program ends at a subsequent boundary setting timing (S150). If the determination made in S150 is negative, CPU 80a returns to S110 again, whereas if the determination made in S150 is affirmative, CPU 80a ends this routine since no more prediction of the number of collection feeders 301 is required. FIG. 5 is a perspective view of feeder base 70 in feeder storage 60. The position of boundary 78 of feeder base 70 is changed as shown in FIGS. 1 to 5, for example.

Figure 6:
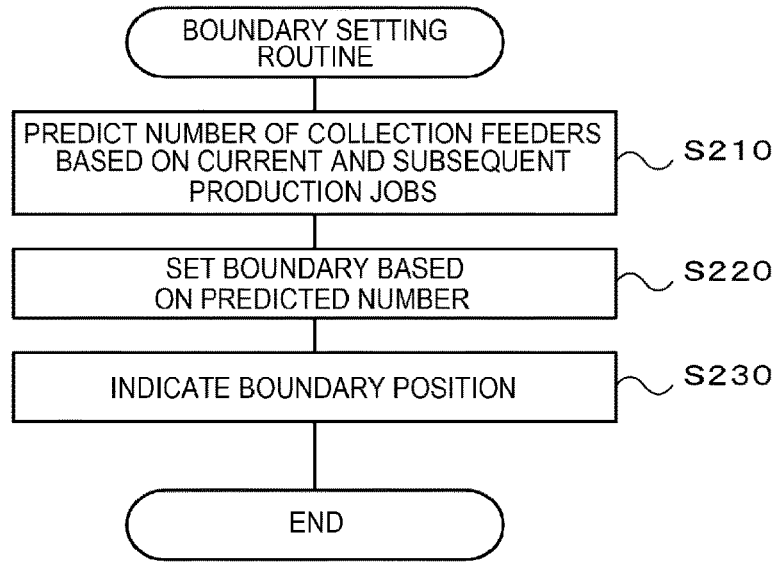
FIG. 6 is a flowchart showing another example of a boundary setting routine.

Another example of the boundary setting routine executed by management computer 80 will be described below by use of a flowchart shown in FIG. 6. A boundary setting routine shown in FIG. 6 is a routine that is executed before production programs, which are processed in component mounting line 12, are switched over. Since component mounting machines 20 involved in a production in component mounting line 12 execute different production jobs before and after production programs are switched over, feeders 30 for use for production are also exchanged as required as the different production jobs are so executed.

When starting the boundary setting routine shown in FIG. 6, CPU 80*a* of management computer 80 first predicts the number of collection feeders 301 based on the present and subsequent production jobs (S210). Specifically, CPU 80*a* determines feeder 30 that is used in the present production job but is not used in a subsequent production job as collection feeder 301 and regards a total number of feeders 30 so determined as the number of collection feeders for each of component mounting machines 20 involved in a production in component mounting line 12. Subsequently, CPU 80*a* sets boundary 78 based on the predicted number of collection feeders 301 (S220). This step S220 is the same as that step S130 described above. Subsequently, CPU 80*a* causes the position of boundary 78 so set to be indicated by controlling illumination of indicators 74 based on that boundary 78 (S230) and ends this routine.

Next, an operation will be described which is performed when loader control device 57 causes loader 50 to execute an automatic exchange of feeders 30 based on an instruction from management computer 80. When receiving an instruction to transfer collection feeder 301 to feeder storage 60 from management computer 80, loader control device 57 causes loader moving mechanism 51 to move loader 50 to the front of feeder base 40 of component mounting machine 20 to which collection feeder 301 is attached. Subsequently, loader control device 57 causes feeder transfer mechanism 53 to detach collection feeder 301 from feeder base 40 in question and house collection feeder 301 so detached in loader 50 and then causes loader moving mechanism 51 to move loader 50 to the front of feeder base 70 of feeder storage 60. Subsequently, loader control device 57 causes feeder transfer mechanism 53 to attach collection feeder 301 in question to a free slot of collection area a1 of feeder base 70. In addition, when receiving a replenishment instruction of supply feeder 302 from management computer 80, loader control device 57 causes loader moving mechanism 51 to move loader 50 to the front of feeder base 70 of feeder storage 60. Subsequently, loader control device 57 causes feeder transfer mechanism 53 to detach supply feeder 302 that is attached to supply area a2 of feeder base 70 and house supply feeder 302 so detached into loader 50 and then causes loader moving mechanism 51 to move loader 50 to the front of feeder base 40 of component mounting machine 20 of a replenishing target. Subsequently, loader control device 57 causes feeder transfer mechanism 53 to attach supply feeder 302 in question to feeder base 40.

Here, the correspondence between the constituent elements of component mounting system 10 of the present embodiment and constituent elements of a component mounting system of the present disclosure will be clarified. Component mounting machine group 14 of the present embodiment corresponds to a component mounting machine group of the present disclosure, feeder storage 60 of the former corresponds to a storage of the latter, loader 50 of the former corresponds to a loader of the latter, and feeder base 70 of the former corresponds to a storage area of the latter. In addition, feeder 30 corresponds to a component supply device, board S corresponds to a mounting target, component mounting machine 20 corresponds to a component mounting machine, CPU 80*a* of management computer 80 corresponds to a control section, and indicator 74 corresponds to a boundary position indicator.

In component mounting system 10 that has been described heretofore, feeder base 70 of feeder storage 60 is divided into collection area a1 where to detachably support collection feeder 301 that is not used for production and supply area a2 where to detachably support supply feeder 302 that is used for production by boundary 78. As a result, there never occurs a case in which collection feeder 301 and supply feeder 302 are stored in a mixed fashion in feeder base 70. This improves the convenience of work in which loader 50 and the operator detach and attach feeder 30 from and to feeder storage 60.

In addition, collection area a1 is provided on the side of feeder base 70 that lies closer to component mounting machine group 14. Loader 50 moves forwards and backwards along component mounting machine group 14. As a result, a movement distance of loader 50 over which loader 50 moves when loader 50 places collection feeder 301 in collection area a1 becomes shorter when collection area a1 is provided on the side closer to component mounting machine group 14 than when collection area a1 is provided on a side farther from component mounting machine group 14, which then serves to make the operation time shorter.

Further, management computer 80 predicts the number of collection feeders 301 and sets boundary 78 based on the number of collection feeders 301 so predicted. As a result, the occurrence of a case in which collection feeder 301 cannot be stored in feeder base 70 of feeder storage 60 can be prevented. Incidentally, when a situation arises in which collection feeder 301 cannot be stored in feeder base 70 of feeder storage 60, loader 50 is placed in a state in which loader 50 has to hold collection feeder 301 housed therein, whereby the operation of loader 50 may be obstructed. On the other hand, since supply feeder 302 is normally stored in feeder storage 60 by the operator, such obstruction is prevented from arising. That is, even if a situation arises in which supply feeder 302 cannot be stored in feeder base 70 of feeder storage 60, free slot 72 is generated if only the operator removes or detaches collection feeder 301 remaining in feeder base 70 from feeder base 70 in question. Then, in the boundary setting routine shown in FIG. 4, when the routine is performed subsequently, collection area a1 is narrowed, while supply area a2 is widened. As a result, the operator can store supply feeder 302 in supply area a2 so widened. Accordingly, boundary 78 is designed to be set based on the number of collection feeders 301 in preference to the number of supply feeders 302.

Furthermore, in predicting the number of collection feeders 301 in the boundary setting routine shown in FIG. 6, management computer 80 calculates the number of feeders 30 that are not to be used in a subsequent production job in feeders 30 that are currently in use before the current production job is switched over to the subsequent production job and refers to the number so calculated as the number of collection feeders 301. As a result, the position of boundary 78 can appropriately be changed before the production jobs are switched over so as to avoid the occurrence of a situation in which collection feeder 301 cannot be stored in feeder base 70 of feeder storage 60.

In addition, in predicting the number of collection feeders 301 in the boundary setting routine shown in FIG. 4, management computer 80 predicts the number (for example, a maximum number) of collection feeders 301 that would result by a subsequent passage of the predetermined time period every predetermined time while component mounting machine 20 is executing repeatedly the production job set individually for component mounting machine 20 in question. As a result, even in a case in which the same production job is repeatedly executed for a long time, the position of the boundary can appropriately be changed every predetermined time until the production job in question is completed.

Further, in setting boundary 78, management computer 80 causes indicators 74 provided on feeder base 70 of feeder storage 60 to indicate boundary 78. As a result, the operator can visually confirm the current setting position of boundary 78.

Needless to say, the present disclosure is not limited to the embodiment that has been described heretofore in any way but can be carried out in various forms without departing from the technical scope of the present disclosure.

Figure 7:
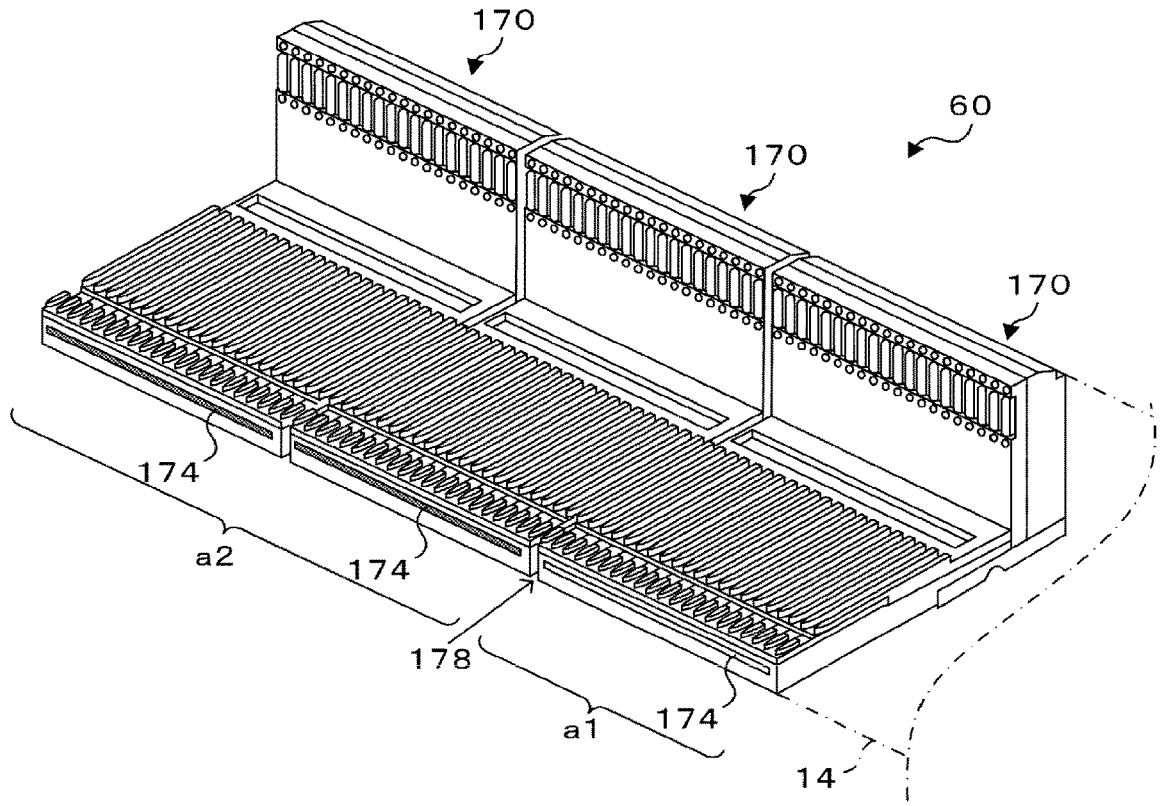
FIG. 7 is a perspective view of three feeder bases 170 in feeder storage 60.
Figure 8:
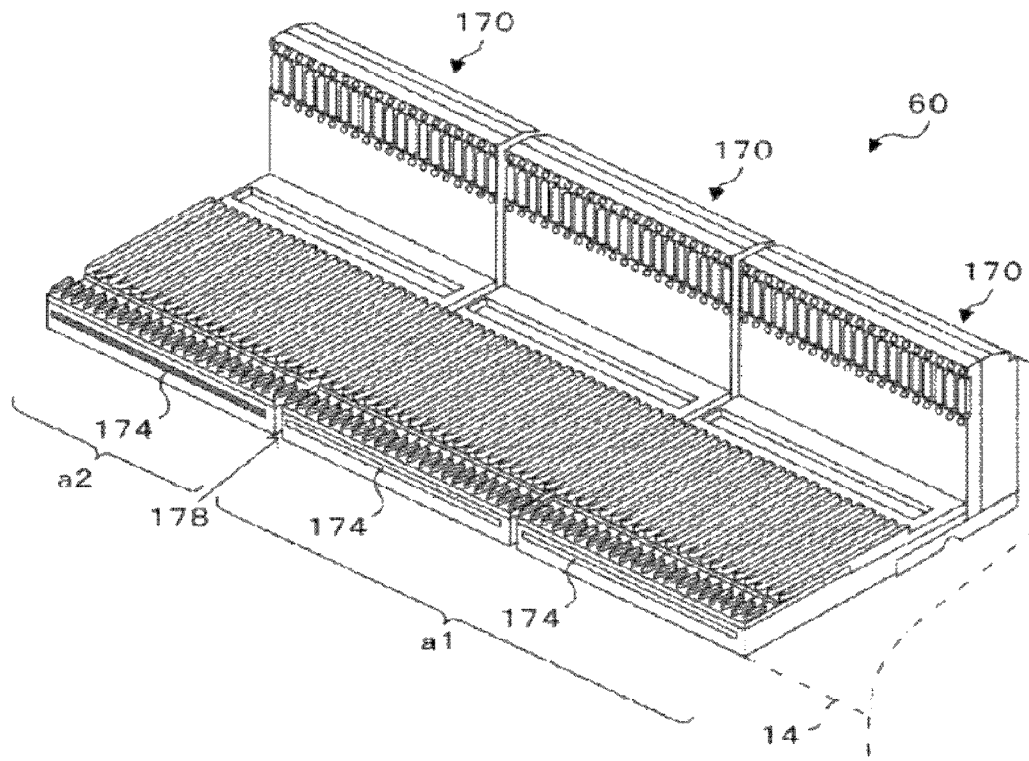
FIG. 8 is a perspective view of three feeder bases 170 in feeder storage 60.

For example, in the embodiment that has been described heretofore, feeder storage 60 is described as including one feeder base 70; however, as shown in FIG. 7, a configuration may be adopted in which feeder storage 60 includes three feeder bases 170 (support tables), and collection area a1 and supply area a2 are set up of feeder base 170 as a unit. Indicator 174 for feeder base 170 is made up of a lamp that is long in the left-right direction. When this indicator 174 is illuminated in red, it indicates that feeder base 170 corresponding to this indicator 174 so illuminated is set to function as collection area a1, whereas when this indicator 174 is illuminated in green, it indicates that feeder base 170 corresponding to this indicator 74 so illuminated is set to function as supply area a2. In FIG. 7, in those three feeder bases 170, right-hand side or rightmost feeder base 170 (lying on a side closer to component mounting machine group 14) is set to constitute collection area a1, and the remaining two feeder bases are set to constitute supply area a2. Boundary 178 is set between right-hand side feeder base 170 and central feeder base 170. On the other hand, in FIG. 8, in three feeder bases 170, right-hand side and central feeder bases 170 (two on a side closer to component mounting machine group 14) are set to constitute collection area a1, and left-hand side feeder base 170 is set to constitute supply area a2. Boundary 178 is set between left-hand side feeder base 170 and central feeder base 170. If a sum of the predicted number of collection feeders 301 and the number of collection feeders 301 that have already been stored in feeder storage 60 is equal to or smaller than the number of slots of one feeder base 170, CPU 80a of management computer 80 sets boundary 178 as shown in FIG. 7, whereas the sum is greater than the number of slots of one feeder base 170 and equal to or smaller than the number of slots of two feeder bases 170, CPU 80a sets boundary 178 as shown in FIG. 8. As a result, since the operator can store feeder bases 170 one by one in feeder storage 60 or remove feeder bases 170 one by one from feeder storage 60, the work efficiency is improved as compared with a case in which feeders 30 are stored or removed one by one.

In the embodiment that has been described heretofore, boundary 78 is set in collection area a1 so that the number of free slots 72 in collection area a1 becomes the same as the predicted number of collection feeders 301; however, the present disclosure is not limited particularly to this. For example, boundary 178 may be set in collection area a1 so that the number of free slots 72 in collection area a1 is greater by a predetermined number (or greater by a predetermined ratio) than the predicted number of collection feeders 301. As a result, even if the number of collection feeders 301 becomes greater than the predicted number of collection feeders 301 in contradiction to the prediction, collection feeders 301 can be stored in collection area a1.

In the embodiment that has been described heretofore, in setting boundary 78, CPU 80a may set boundary 78 so that a minimum required number of slots remains in both collection area a1 and supply area a2. For example, when setting collection area a1 based on the predicted number of collection feeders 301, collection area a1 may be set so that a number resulting from deducting the minimum required number of slots in supply area a2 from the total number of slots on feeder base 70 constitutes an upper limit of the number of slots in collection area a1.

In the embodiment that has been described heretofore, CPU 80a of management computer 80 may display on display 82 a guidance screen for prompting a removal of collection feeder 301 from feeder storage 60 when the number of collection feeders 301 stored in feeder base 70 of feeder storage 60 reaches a predetermined ratio to the total number of slots of feeder base 70. As a result, since the operator, who has viewed the guide screen, performs a removal operation of collection feeder 301 from feeder storage 60, securing a free slot in feeder base 70 can be facilitated.

In the embodiment that has been described heretofore, a lamp may be provided on a front surface of feeder 30. In this case, feeder control device 34 may be configured to receive information on feeder 30 set in feeder base 70 from management computer 80 to cause the lamp to be illuminate in red when feeder 30 in question is a collection feeder, whereas feeder control device 34 may cause the lamp to be illuminated in green when feeder 30 in question is a supply feeder. As a result, the operator can determine whether feeder 30 set in correction area a1 is collection feeder 301 or supply feeder 302 and whether feeder 30 set in supply area a2 is collection feeder 301 or supply feeder 302 based on the color of the illuminated lamp of feeder 30 in question. This enables the operator to determine easily whether collection feeder 301 is correctly set in collection area a1 and whether supply feeder 302 is correctly set in supply area a2.

In the embodiment that has been described heretofore, indicator 74 is provided on the front surface of feeder base 70; however, instead of this configuration, an indicator similar to indicator 74 may be provided on a table of feeder storage 60 on which feeder base 70 is placed. In this case, the indicator only needs to be provided in a position lying ahead of feeder base 70 and corresponding to each slot 72.

In the embodiment that has been described above, management computer 80 is described as changing boundary 78; however, alternatively or in addition to this configuration, the operator may be made to change boundary 78 arbitrarily by operating input device 84. In addition, in indicating boundary 78, where to indicate boundary 78 is not limited to where the color of indicators 74 changes, and hence, for example, boundary 78 may be indicated by a lamp with a Δ mark, or a boundary position may be indicated by characters by use of liquid crystal or the like.

Figure 9:
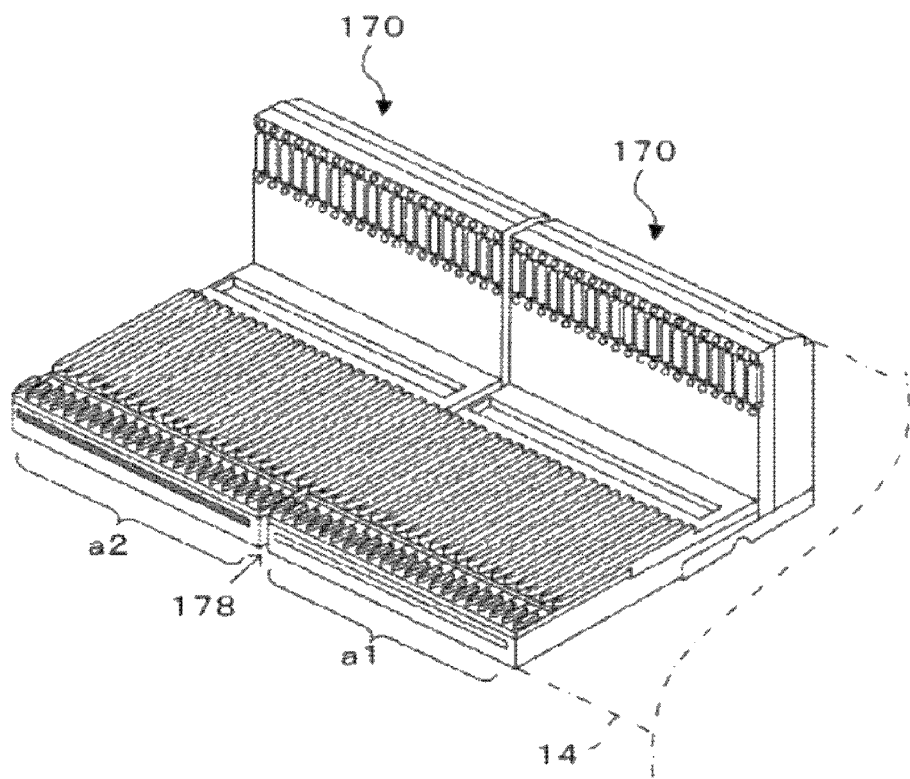
FIG. 9 is a perspective view of two feeder bases 170 in feeder storage 60.

In the embodiment that has been described heretofore, boundary 78 provided on feeder base 70 of feeder storage 60 is described as being changeable in position; however, boundary 78 may be made unchangeable in position. For example, as shown in FIG. 9, a configuration may be adopted in which two feeder bases 70 are disposed in feeder storage 60 in such a manner that feeder base 70 on a side closer to component mounting machine group 14 constitutes collection area a1, while feeder base 70 on a side farther from component mounting machine group 14 constitutes supply area a2, and boundary 78 is formed between those two feeder bases 70. In this case, feeder base 40 without any indicator may be used in place of feeder base 70. Alternatively, in a case that one feeder base 70 is disposed in feeder storage 60 as shown in FIG. 1, the position of boundary 78 may be made unchangeable.

In the embodiment that has been described heretofore, feeder storage 60 is described as being disposed at the upstream side of component mounting machine group 14; however, instead of or in addition to that configuration, feeder storage 60 may be disposed at a downstream side of component mounting machine group 14. In addition, two or more feeder storages 60 may be disposed in series at the upstream side (or the downstream side) of component mounting machine group 14.

In the embodiment that has been described heretofore, there may be added to component mounting line 12 a solder printing machine for printing solder on board S with no component mounted thereon yet or an inspection machine for inspecting board S with a component mounted already thereon to see whether the component is correctly mounted on board S. In addition, component mounting machine group 14 and feeder storage 60 may be adjacent to each other; however, a solder printing machine or the like may be disposed between component mounting machine group 14 and feeder storage 60.

In the embodiment that has been described heretofore, loader 50 is described as executing the operation of exchanging feeders 30 for component mounting machine 20; however, the operator may execute this operation. In this case, a guidance for how to exchange feeders 30 may be caused to be displayed on touch panel display 27 of component mounting machine 20 or display 82 of management computer 80, so that the operator can exchange feeders 30 in accordance with the guidance so displayed.

In the embodiment that has been described heretofore, feeder 30 is exemplified as a component supply device; however, the present disclosure is not particularly limited thereto, and hence, for example, a tray on which multiple components are placed may be adopted as a component supply device.

The component mounting system of the present disclosure may be configured as follows.

In the component mounting system of the present disclosure, the storage area may include multiple support tables configured to support detachably some of the multiple component supply devices that are arranged in an aligned fashion, and the collection area and the supply area may be set up of the support table as a unit. As a result, since the support tables each supporting some of the multiple component supply devices can be stored in and removed from the storage container one by one, the work efficiency is improved compared with a case in which the component supply devices are stored in and removed from the storage container one by one.

In the component mounting system of the present disclosure, the collection area may be provided at a side of the storage area that lies closer to the component mounting machine. The loader moves back and forth in the area where the multiple component mounting machines are arranged in the aligned fashion. Due to this, the movement distance of the loader over which the loader travels when the loader places the component supply device that is not used for production in the collection area gets shorter with the collection area provided at the side closer to the component mounting machine than with the collection area provided at the side farther from the component mounting machine, which then results in a reduction in the operation time.

The component mounting system of the present disclosure may include a control section configured to predict the number of the component supply devices for collection to set the boundary based on the number of the component supply devices for collection so predicted. As a result, the occurrence of a situation can be prevented in which the component supply device for collection cannot be stored in the storage area.

In this case, in predicting the number of the component supply devices for collection, the control section may calculate the number of component supply devices that are not to be used in a subsequent production job in the component supply devices that are currently in use before the current production job is switched over to the subsequent production job and refers to the number so calculated as the number of the component supply devices for collection. As a result, the position of the boundary can appropriately be changed before the production jobs are switched over so as to avoid the occurrence of a situation in which the component supply device for collection cannot be stored in the storage area.

Alternatively, in predicting the number of the component supply devices for collection, the control section may predict the number (for example, a maximum number) of the component supply devices for collection that would result by a subsequent passage of the predetermined time period every predetermined time while the component mounting machine is executing repeatedly a production job set individually for the component mounting machine in question. As a result, even in a case in which the same production job is repeatedly executed for a long time period, the position of the boundary can appropriately be changed every predetermined time until the production job is completed.

In addition, in setting the boundary, the control section may cause a boundary position indicator provided in the storage area to indicate the boundary. As a result, the operator can visually confirm the current setting position of the boundary.

INDUSTRIAL APPLICABILITY

The present disclosure can be applied to a technical field in which a component is mounted on a mounting target using a component mounting machine group.

REFERENCE SIGNS LIST 10 component mounting system, 12 component mounting line, 14 component mounting machine group, 18 X-axis rail, 20 component mounting machine, 20A supply area, 20B stock area, 21 board conveyance device, 22 head, 23 head moving mechanism, 27 touch panel display, 28 mounting control device, 30 feeder, 32 tape reel, 33 tape feeding mechanism, 34 feeder control device, 40 feeder base, 42 slot, 45 connector, 50 loader, 50A upper transfer area, 50B lower transfer area, 51 loader moving mechanism, 53 feeder transfer mechanism, 55 encoder, 57 loader control device, 60 feeder storage, 70 feeder base, 72 slot, 74 indicator, 75 connector, 78 boundary, 80 management computer, 80$a$ CPU, 80$b$ ROM, 80$c$ RAM, 80$d$ HDD, 82 display, 84 input device, 170 feeder, 174 indicator, 178 boundary, 301 collection feeder, 302 supply feeder, a1 collection area, a2 supply area

The invention claimed is:

1. A component mounting system comprising:
   a component mounting machine group made up by aligning multiple component mounting machines along a conveyance direction of a mounting target object, the component mounting machines each including multiple component supply devices that are set detachably and configured to mount a component supplied by the component supply devices onto the mounting target object;
   a storage container provided at an upstream side or a downstream side of the component mounting machine group and having a storage area configured to detachably support some of the multiple component supply devices that are arranged in an aligned fashion; and
   a loader configured to move along the conveyance direction to automatically detach and/or attach the component supply devices from and/or to the component mounting machines and the storage container,
   wherein the storage area is divided by a boundary into a collection area configured to detachably support a component supply device for collection that is not used for production and a supply area configured to detachably support a component supply device for supply that is used for production.

2. The component mounting system according to claim 1, wherein the storage area comprises multiple support tables configured to detachably support the some of the multiple component supply devices that are arranged in the aligned fashion, and the collection area and the supply area are set up on the support tables as a unit.

3. The component mounting system according to claim 1, wherein the collection area is provided at a side of the storage area that lies closer to the component mounting machines.

4. The component mounting system according to claim 1, further comprising:
   a control section configured to predict a number of the component supply devices for collection to set the boundary based on the number of the component supply devices for collection so predicted.

5. The component mounting system according to claim 4, wherein in predicting the number of the component supply devices for collection, the control section calculates the number of component supply devices that are not to be used in a subsequent production job in the component supply devices that are currently in use before a current production job is switched over to the subsequent production job and refers to the number so calculated as the number of the component supply devices for collection.

6. The component mounting system according to claim 4, wherein in predicting a number of the component supply devices for collection, the control section predicts a number of the component supply devices for collection that would result by a subsequent passage of a predetermined time period every predetermined time while the component mounting machine is executing repeatedly a production job set individually for the component mounting machine in question.

7. The component mounting system according to claim 4, wherein in setting the boundary, the control section causes a boundary position indicator provided in the storage area to indicate the boundary.

* * * * *